US010121491B2

(12) United States Patent
Ozcan et al.

(10) Patent No.: US 10,121,491 B2
(45) Date of Patent: Nov. 6, 2018

(54) INTELLIGENT VOLUME CONTROL INTERFACE

(71) Applicant: Nokia Technologies Oy, Espoo (FI)

(72) Inventors: Koray Ozcan, Farnborough (GB); Miikka Vilermo, Siuro (FI)

(73) Assignee: Nokia Technologies Oy, Espoo (FI)

( * ) Notice: Subject to any disclaimer, the term of this patent is extended or adjusted under 35 U.S.C. 154(b) by 24 days.

(21) Appl. No.: 14/958,394

(22) Filed: Dec. 3, 2015

(65) Prior Publication Data
US 2016/0180863 A1 Jun. 23, 2016

(30) Foreign Application Priority Data
Dec. 22, 2014 (GB) .................................. 1422926.4

(51) Int. Cl.
G10L 21/034 (2013.01)
H03G 3/32 (2006.01)
(Continued)

(52) U.S. Cl.
CPC ........... *G10L 21/034* (2013.01); *H03G 3/005* (2013.01); *H03G 3/10* (2013.01); *H03G 3/32* (2013.01); *H03G 5/005* (2013.01); *H03G 5/165* (2013.01); *H03G 7/002* (2013.01); *H03G 7/007* (2013.01); *H03G 9/025* (2013.01); *H04R 3/04* (2013.01); *H04R 2430/01* (2013.01)

(58) Field of Classification Search
CPC .......... G10L 21/034; H03G 3/02; H03G 3/10; H03G 3/32; H03G 5/005; H03G 5/165; H03G 7/002; H03G 7/007; H03G 9/025; H04R 3/04; H04R 2430/01

USPC ........................... 381/57, 102, 106, 107, 109
See application file for complete search history.

(56) References Cited

U.S. PATENT DOCUMENTS 6,011,853 A    1/2000  Koski et al.
7,567,898 B2   7/2009  Bennett
(Continued)

FOREIGN PATENT DOCUMENTS

EP        1511039 A1    3/2005
JP     2007-158614 A    6/2007
(Continued)

OTHER PUBLICATIONS

Extended European Search Report received for corresponding European Patent Application No. 15194225.7, dated Jun. 13, 2016, 6 pages.
(Continued)

Primary Examiner — David Ton
(74) Attorney, Agent, or Firm — Alston & Bird LLP

(57) ABSTRACT

The invention relates to a method, comprising receiving a first audio signal during an application execution in an apparatus, determining a volume level of a volume control interface for controlling a volume level of the first audio signal, controlling processing the first audio signal by at least one digital signal processing algorithm determined on the basis of the determined volume level of the volume control interface for controlling the volume level of the first audio signal, and outputting the controlled processed first audio signal at the determined volume level of the volume control interface. The invention further relates to an apparatus and a computer program product that perform the method.

20 Claims, 5 Drawing Sheets

(51) Int. Cl.
*H03G 5/00* (2006.01)
*H03G 5/16* (2006.01)
*H03G 9/02* (2006.01)
*H03G 3/00* (2006.01)
*H03G 3/10* (2006.01)
*H03G 7/00* (2006.01)
*H04R 3/04* (2006.01)

(56) References Cited

U.S. PATENT DOCUMENTS

| | | | |
|---|---|---|---|
| 8,180,064 B1 | 5/2012 | Avendano et al. | |
| 2007/0098188 A1 | 5/2007 | Felder | |
| 2007/0223736 A1 | 9/2007 | Stenmark et al. | |
| 2008/0013751 A1 | 1/2008 | Hiselius | |
| 2008/0144860 A1 | 6/2008 | Haller et al. | |
| 2008/0170723 A1 | 7/2008 | Sakagami et al. | |
| 2009/0252350 A1 | 10/2009 | Seguin | |
| 2010/0211199 A1* | 8/2010 | Naik | G10L 21/00 700/94 |
| 2010/0232626 A1* | 9/2010 | Paquier | H04S 1/007 381/119 |
| 2012/0054611 A1* | 3/2012 | Perrodin | G11B 27/34 715/716 |
| 2014/0173519 A1 | 6/2014 | Sassi | |
| 2015/0280669 A1 | 10/2015 | Vilermo et al. | |

FOREIGN PATENT DOCUMENTS

| | | |
|---|---|---|
| JP | 2010-258776 A | 11/2010 |
| WO | 2004/036367 A2 | 4/2004 |
| WO | 2005/069275 A1 | 7/2005 |
| WO | 2014/161091 A1 | 10/2014 |
| WO | 2014/161091 A8 | 10/2014 |

OTHER PUBLICATIONS

"Equalizer + (Music Player Volume Booster) Music App Review (iOS, Free)", Apptism, Retrieved on Nov. 23, 2015, Webpage available at : http://www.apptism.com/music/djit/equalizer-music-player-volume-booster/.

Chanda et al., "Speech Intelligibility Enhancement Using Tunable Equalization Filter", IEEE International Conference on Acoustics, Speech and Signal Processing, vol. 4, Apr. 15-20, 2007, pp. 613-616.

"Automatic Volume and eQualization Control", Alango Technologies and Solutions, Retrieved on Nov. 23, 2015, Webpage available at : http://www.alango.com/technologies-avq.php.

"Apple Proposes Audio Sensor to Auto-Adjust Iphone Ringtones", Appleinsider, Retrieved on Nov. 23, 2015, Webpage available at : http://appleinsider.com/articles/09/01/22/apple_proposes_audio_sensor_to_auto_adjust_iphone_ringtones.

"Dynamic Range Compression", Wikipedia, Retrieved on Nov. 23, 2015, Webpage available at : https://en.wikipedia.org/wiki/Dynamic_range_compression.

Search Report received for corresponding United Kingdom Patent Application No. 1422926.4, dated May 5, 2015, 7 pages.

Office action received for corresponding European Patent Application No. 15194225.7, dated Feb. 13, 2017, 4 pages.

Office Action for European Application No. EP 15 194 225.7 dated Oct. 16, 2017, 4 pages.

Office Action for European Patent Application No. 15 194 225.7 dated Jul. 13, 2017, 4 pages.

Office Action for European Application No. 15 194 225.7 dated Apr. 11, 2018, 4 pages.

Office Action for European Application No. 15 194 225.7 dated Aug. 8, 2018, 4 pages.

* cited by examiner

INTELLIGENT VOLUME CONTROL INTERFACE

BACKGROUND

Today smart device users use their smart devices for several purposes. Many of these purposes relate to or include audio signal, sound. Users may, for example, listen to music or radio, watch videos, play games, or receive or make a voice call, a video call, a voice/video call, for example, over a mobile network or VOIP etc. In many cases, the smart device users use their smart devices for several purposes simultaneously. For example, when they listen to music, the music may be played in the background while they use the smart device for some other purposes. In some cases, users may even use their devices for two different purposes relating to or including voice or they may use their device in a noisy environment. These situations may require voice controlling to enable hearing the primary audio signal, sound.

SUMMARY

Now there has been invented an improved method and technical equipment implementing the method. Various aspects of the invention include a method, an apparatus, and a computer readable medium comprising a computer program stored therein, which are characterized by what is stated in the independent claims. Various embodiments of the invention are disclosed in the dependent claims.

According to a first aspect, there is provided a method, comprising receiving a first audio signal during an application execution in an apparatus, determining a volume level of a volume control interface for controlling a volume level of the first audio signal, processing the first audio signal by at least one digital signal processing algorithm determined on the basis of the determined volume level of the volume control interface for controlling the volume level of the first audio signal, and outputting the processed first audio signal at the determined volume level of the volume control interface.

According to an embodiment, determining the volume level of the volume control interface is performed as a response to operation of the volume control interface. According to an embodiment, said at least one digital signal processing algorithm changes as a function of the volume level. According to an embodiment, the method further comprises adjusting the volume level of the received first audio signal as a response to volume level processing performed by the volume control interface. According to an embodiment, the method further comprises determining a volume level of the first audio signal after adjustment, and performing processing and outputting steps on the basis of determined volume level of the first audio signal after adjustment. According to an embodiment, the method further comprises receiving a second audio signal during a second application execution in the apparatus simultaneously with the first audio signal, determining a volume level of the second audio signal, processing the second audio signal by at least one digital signal processing algorithm determined on the basis of the determined volume level of the second audio signal, and outputting the processed second audio signal at the determined volume level of the second audio signal. According to an embodiment, the method further comprises adjusting volume levels of the processed first audio signal and the processed second audio signal so that the first audio signal is outputted at a first volume level and the second audio signal is outputted at a second volume level. According to an embodiment, the method further comprises controlling spatial location of the first and the second audio signals, before outputting the first and the second audio signals. According to an embodiment, said at least one digital signal processing algorithm is an equalization method. According to an embodiment, said at least one digital signal processing algorithm is a dynamic range compression (DRC) method. According to an embodiment, the method further comprises determining an environment noise level, and adjusting the voice level of at least the first audio signal on the basis of the determined environment noise level.

According to a second aspect, there is provided an apparatus comprising a volume control interface, at least one processor, memory including computer program code, the memory and the computer program code configured to, with the at least one processor, cause the apparatus to perform at least the following: receive a first audio signal during an application execution in an apparatus, determine a volume level of the volume control interface for controlling a volume level of the first audio signal, process the first audio signal by at least one digital signal processing algorithm determined on the basis of the determined volume level of the volume control interface for controlling the volume level of the first audio signal, and output the processed first audio signal at the determined volume level of the volume control interface.

According to an embodiment, the volume level of the volume control interface is determined as a response to operation of the volume control interface. According to an embodiment, said at least one digital signal processing algorithm changes as a function of the volume level. According to an embodiment, the apparatus is further caused to adjust the volume level of the received first audio signal as a response to volume level processing performed by the volume control interface. According to an embodiment, the apparatus is further caused to determine a volume level of the first audio signal after adjustment, and perform processing and outputting steps on the basis of determined volume level of the first audio signal after adjustment. According to an embodiment, the apparatus is further caused to receive a second audio signal during a second application execution in the apparatus simultaneously with the first audio signal, determine a volume level of the second audio signal, process the second audio signal by at least one digital signal processing algorithm determined on the basis of the determined volume level of the second audio signal, and output the processed second audio signal at the determined volume level of the second audio signal. According to an embodiment, the apparatus is further caused to adjust volume levels of the processed first audio signal and the processed second audio signal so that the first audio signal is outputted at a first volume level and the second audio signal is outputted at a second volume level. According to an embodiment, the apparatus is further caused to control spatial location of the first and the second audio signals, before outputting the first and the second audio signals. According to an embodiment, said at least one digital signal processing algorithm is an equalization method. According to an embodiment, said at least one digital signal processing algorithm is a dynamic range compression (DRC) method. According to an embodiment, the apparatus is further caused to determine an environment noise level, and adjust the voice level of at least the first audio signal on the basis of the determined environment noise level. According to an embodiment, said at least one digital signal processing algorithm is preconfigured for at least one volume level. According to an embodiment, said apparatus is a mobile device.

According to a third aspect, there is provided an apparatus comprising: means for receiving a first audio signal during an application execution in an apparatus, means for determining a volume level of a volume control interface for controlling a volume level of the first audio signal, means for processing the first audio signal by at least one digital signal processing algorithm determined on the basis of the determined volume level of the volume control interface for controlling the volume level of the first audio signal, and means for outputting the processed first audio signal at the determined volume level of the volume control interface.

According to an embodiment, the apparatus comprises means for determining the volume level of the volume control interface is performed as a response to operation of the volume control interface. According to an embodiment, said at least one digital signal processing algorithm changes as a function of the volume level. According to an embodiment, the apparatus further comprises means for adjusting the volume level of the received first audio signal as a response to volume level processing performed by the volume control interface. According to an embodiment, the apparatus further comprises means for determining a volume level of the first audio signal after adjustment, and performing processing and outputting steps on the basis of determined volume level of the first audio signal after adjustment. According to an embodiment, the apparatus further comprises means for receiving a second audio signal during a second application execution in the apparatus simultaneously with the first audio signal, determining a volume level of the second audio signal, processing the second audio signal by at least one digital signal processing algorithm determined on the basis of the determined volume level of the second audio signal, and outputting the processed second audio signal at the determined volume level of the second audio signal 1. According to an embodiment, the apparatus further comprises means for adjusting volume levels of the processed first audio signal and the processed second audio signal so that the first audio signal is outputted at a first volume level and the second audio signal is outputted at a second volume level. According to an embodiment, the apparatus further comprises means for controlling spatial location of the first and the second audio signals, before outputting the first and the second audio signals. According to an embodiment, said at least one digital signal processing algorithm is an equalization method. According to an embodiment, said at least one digital signal processing algorithm is a dynamic range compression (DRC) method. According to an embodiment, the apparatus further comprises means for determining an environment noise level, and adjusting the voice level of at least the first audio signal on the basis of the determined environment noise level.

According to a fourth aspect, there is provided a computer program embodied on a non-transitory computer readable medium, the computer program comprising instructions causing, when executed on at least one processor, at least one apparatus to receive a first audio signal during an application execution in an apparatus, determine a volume level of a volume control interface for controlling a volume level of the first audio signal, process the first audio signal by at least one digital signal processing algorithm determined on the basis of the determined volume level of the volume control interface for controlling the volume level of the first audio signal, and output the processed first audio signal at the determined volume level of the volume control interface.

According to an embodiment, the volume level of the volume control interface is determined as a response to operation of the volume control interface. According to an embodiment, said at least one digital signal processing algorithm changes as a function of the volume level. According to an embodiment, the apparatus is further caused to adjust the volume level of the received first audio signal as a response to volume level processing performed by the volume control interface. According to an embodiment, the apparatus is further caused to determine a volume level of the first audio signal after adjustment, and perform processing and outputting steps on the basis of determined volume level of the first audio signal after adjustment. According to an embodiment, the apparatus is further caused to receive a second audio signal during a second application execution in the apparatus simultaneously with the first audio signal, determine a volume level of the second audio signal, process the second audio signal by at least one digital signal processing algorithm determined on the basis of the determined volume level of the second audio signal, and output the processed second audio signal at the determined volume level of the second audio signal. According to an embodiment, the apparatus is further caused to adjust volume levels of the processed first audio signal and the processed second audio signal so that the first audio signal is outputted at a first volume level and the second audio signal is outputted at a second volume level. According to an embodiment, the apparatus is further caused to control spatial location of the first and the second audio signals, before outputting the first and the second audio signals. According to an embodiment, said at least one digital signal processing algorithm is an equalization method. According to an embodiment, said at least one digital signal processing algorithm is a dynamic range compression (DRC) method. According to an embodiment, the apparatus is further caused to determine an environment noise level, and adjust the voice level of at least the first audio signal on the basis of the determined environment noise level. According to an embodiment, said at least one digital signal processing algorithm is preconfigured for at least one volume level. According to an embodiment, said apparatus is a mobile device.

DESCRIPTION OF THE DRAWINGS

In the following, various embodiments of the invention will be described in more detail with reference to the appended drawings, in which.

DESCRIPTION OF EXAMPLE EMBODIMENTS

Figure 1:
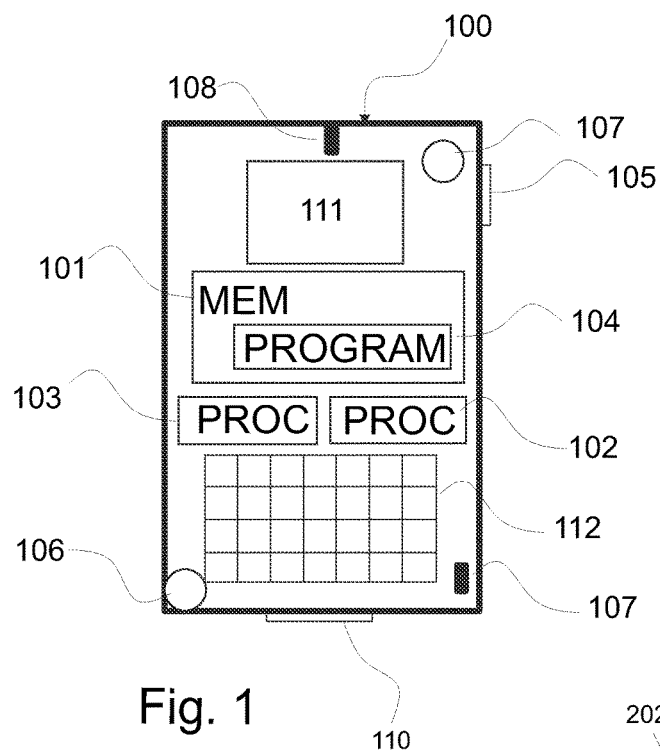
FIG. 1 shows an apparatus according to an example embodiment.

In the following, several embodiments of the invention will be described in the context of a device, for example, a smart device. The device is suitable for processing downlink audio signals and playing at least two audio signals at a time. The term "processing" may, in this context, refer any type of processing and/or controlling operation. Processing may refer to, for example, signal processing of audio signal by one or more digital signal processing algorithms and/or adjusting volume level of audio signal. The device may comprise means for processing audio signals, for example, the device may comprise processing circuitry and electronics for digital signal processing and/or adjusting volume level of played audio signal, computer program code in a memory, and a processor that, when running the computer program code, causes the device to carry out signal processing of audio signal and/or adjusting volume level of audio signal configured to be played. In addition, the device comprises means for playing audio signals, for example, a loudspeaker, a hands-free headset output or a head phone output, each of which may be coupled to the audio output of the device. Further, the device may comprise means for processing the outputted volume level by a user of the device, for example, a volume control interface that is a user controllable interface, wherein the volume control interface may be a volume control button, a potentiometer, an electrical circuit, a switch or any other interface suitable for controlling voice. The term "audio signal" may, in this context, be any sound suitable to be played by the device. It may be, for example, audio portion of video or online based audio/video playback, music, communication voice of phone, Skype or video conference call, notification or alarming sounds of the device, radio voice, online based audio/video playback, etc. Audio signals may have frequencies in the audio frequency range of around 20 to 20,000 Hz, which are the limits of human hearing.

The device processing and playing a downlink audio signal or at least two downlink audio signals at a time may be any portable electronic device, for example, a smart device, a mobile phone, a mobile computer, a mobile collaboration device, a mobile internet device, a smart phone, a tablet computer, a tablet personal computer (PC), a personal digital assistant, a handheld game console, a portable media player, a digital video camera (DVC or digital camcorder), a pager, cellular electronic device, a non-cellular electronic device, or a personal navigation device (PND). However, it is also possible that the device is not a mobile device, it may also be any other device capable of playing at least two audio signals, and comprising a processing means, for example, a volume control interface that is a user controllable interface by which a user may process digital signal processing of played audio signal(s) and/or adjusting volume level of at least one played audio signal.

Device users may use their device for several purposes. Many of these purposes relate to or include audio signal i.e. sound. The user may, for example, listen to music or radio, watch videos, play games, or speak voice calls etc. In many cases, the smart device user uses their smart devices for several purposes simultaneously. For example, when he listens to music, the music may be played in the background while he uses the smart device for some other purposes. In some cases, the user may even use his device for two different purposes comprising audio signals, for example, the user may listen to music while receiving or making a call i.e. during an active call or he may use his device in a noisy environment. The term "call" may refer in this context to any call including audio signal over a mobile network or Voice over Internet Protocol (VoIP), for example, a voice call i.e. a speech call, a video call etc. These situations may require voice processing i.e. processing of at least one audio signal for enabling hearing the main audio signal. In existing devices, the device automatically usually mutes a first sound to accommodate the second sound, for example the device mutes the music volume to accommodate the voice in the call. However, instead of muting other audio signal i.e. played sound, the device according to embodiments of the invention provides a user a possibility to control both audio signals using a single volume control interface, in this example, the music and voice of the call. The idea is to change the volume levels of all played audio signals alternatingly at intervals when the volume control interface is operated. It is also possible that volume level of one of the audio signals, for example, main or secondary audio signal is changed when the volume control interface is operated, and the other(s) remains the same. This means that at least one, some or all states, sub-sections, of volume control range divided to sub-sections have different settings, configuration, for both audio signals when compared to settings of other sub-sections. This means that volume level of audio signals may be different at one or more sub-sections, the relative difference of audio signals may also be different at one or more sub-sections. There may be, for example, 10 sub-sections, or the number of sub-sections may be preconfigured to be suitable for the user or the device. Number of sub-sections may be, for example, between 2 to 20. The relative difference range between audio signals may be arranged as desired, for example, between 3-12 dB, but the relative difference range may also be wider or narrower, for example 1-15 dB, 3-10 dB, 5-18 dB or any other selected range between 0 and 20 dB.

In this way the user may always choose the desired volume levels for audio signals received during an application execution in an apparatus by selecting a suitable sub-section of a volume control range. For example, he may select so that voice of a call remains intelligible and the music remains enjoyable as the background sound. Processable audio signals may be from different applications or even from the same application. Processable audio signals may be, for example, audio signals of a game application and music player application or audio signals of a video player application and call or any other application generating an audio signal or audio signals. It is also possible that there are more than two sounds i.e. audio signals of more than two applications, for example, 3-5 audio signals, that are processable by the user through a volume control interface.

The user may, for example, by operating a volume control interface of a device, for example, by pushing, sliding, touching, rotating, etc., select a sub-section, where the volume level of an audio signal of a main application is at a higher level than volume level(s) of audio signal(s) of one or more application other than the main application. The main application may be, for example, an active application or the most important application. Applications generating audio signal may be arranged in order of importance in advance. The main application may be, for example, a call. In many cases, the volume level of the main application is typically at a higher level than volume level(s) of other application(s). In other words, desired volume levels for audio signals of different applications are selectable by the volume control interface by selecting suitable sub-section of a volume control range.

In addition, a volume control interface may be used to optimize audio signal(s), for example, by one or more digital signal processing algorithms in combination with the volume controlling or instead of the volume controlling. There may be different audio signal optimizing configuration(s) for one or more audio signal(s) at different volume control interface settings, sub-sections. In other words, one, some or all states, sub-sections, of volume control range divided to sub-sections may further have different optimization method settings, configurations, in addition to volume control configuration(s) for one or more audio signals when compared to optimization method configuration(s) of at least one other sub-section. The audio signal optimization method may refer in this context to digital signal processing (DSP) algorithm(s), for example, to an audio signal equalization optimization method and/or an audio signal optimization method comprising audio signal equalization method and/or dynamic range compression (DRC) method. In other words, audio signal(s) may be optimized as a function of the change of sub-section of the volume control range. Sub-section can be changed by operation of the volume control interface, where the operation of the volume control interface may control volume level(s), DSP algorithm(s) or both volume level(s) and DSP algorithm(s), wherein the DSP algorithm(s) may be optimized on the basis of the selected volume level (sub-section). On the basis of determined volume level of the selected volume level i.e. sub-section of the volume control range audio signals arranged to be outputted may be processed by at least one digital signal processing algorithm determined on the basis of the determined volume level. As an example, on the basis of operation of a volume control interface volume level may be determined and at least one DSP algorithm may be determined for an audio signal and the audio signal may be processed by at least one digital signal processing algorithm determined on the basis of the determined volume level. However, it is possible that only one or part of these DSP algorithms is/are determined on the basis of determined volume level and the rest of the algorithms remain the same for all volume levels i.e. they are not dependent on volume level. There may also be other algorithms comprising transducer protection algorithm, which could be determined in a desired manner on the basis of determined volume levels.

The existing systems for volume and signal optimization control, for example, equalization control, either may give the user no control over the signal optimization, which may mean that the control is automated, or at least the signal optimization control is hidden behind access menus. However, users may have different needs for volume level(s) and signal optimization in general and at least in different use cases. In other words, user preferences may vary. Therefore they may need easy access for customizing the audio signal or audio signals by signal processing in addition to volume control. Automatic signal optimization control may not select the optimal equalization based on the used application, because users use the same applications for many purposes e.g. a mobile network or a Voice over Internet Protocol (VOIP) call for sharing a live concert or talking with friends, or listening to music. Therefore, an automatic equalization control system or other signal optimization control may not always select the type of signal optimization, for example, equalization, as the user desires. Therefore, easy access to equalization control, for example, by the volume control interface is preferable.

As explained above, it is possible to control voice level(s) of two or more downlink audio signals outputted by a device by a volume control interface of the device. There may be different volume configurations, settings, for two or more downlink audio signals in at least one sub-section of the volume control range. As also explained above, it is further possible to control audio signal processing configurations of one or more downlink audio signals by the same volume control interface having different optimizing i.e. audio signal processing configurations for one or more downlink audio signals in at least one different sub-section when compared to at least one other sub-section. This optimizing configuration controlling may be possible in addition or instead of controlling volume level(s).

The desired volume level and/or type and amount of downlink audio optimization in a desired downlink audio signal or signals may be achieved by using a single volume control interface by selecting a sub-section of the volume level range by the volume control interface. On the basis of selected sub-section at least two downlink audio signals may be outputted at desired and different volume levels and possibly also at least one of the at least two downlink audio signals may be optimized by at least one digital signal processing algorithm determined for said at least one of the at least two downlink audio signals on the basis of the volume level of selected sub-section.

The volume level and signal optimization configuration at different sub-sections may be assisted by an internal microphone of a device. The microphone may capture the background noise to provide an indication to the volume control system of the device in order to finalize the output volume level and signal processing configurations for at least one sub-section of the volume range so that the noise may be taken into account in volume level and/or signal processing configurations. User of the device may then set/select suitable settings by the single volume interface. In other words, if captured background noise is low, the device may configure different setting for sub-sections than in a situation, when the background level is captured to be high. For example, the relative difference of downlink audio signals and also the optional equalization strength for downlink audio signal(s) may be arranged differently at the certain sub-section for different absolute levels of background noise. The absolute levels of background noise may be, for example, <50 dB, 50-70 dB and >70 dB. There may also be more categories for background noise levels, and the categories may be preselected and determined for the volume control system as desired. In noisy environments, it may be understood that signal loudness is an important parameter. While the environment volume level, background noise, increases, the output volume level of at least one downlink audio signal, for example, of an active application or a call, may automatically increase and signal processing configurations of at least one downlink audio signal, for example, of the active application or the call may be tuned to perform better in the noisy environment. For example, band limited harmonic distortion can be considered for the high end of the frequency response. Although such approach changes the timbre of the output audio signal, such improved loudness could provide better performance in noisy environments. It should be noted that background noise determination may be achieved via some other solution than microphone, for example, from GPS determining location information etc. In addition, also one or more downlink audio signals of other application than an active application may be configured i.e. volume level may be adjusted and audio signal processing algorithms may be determined and processed. In addition to background noise level, other background noise characteristics may affect the signal optimization i.e. determined signal processing algorithms at different sub-sections. For example, background noise frequency characteristics may affect signal processing algorithms to be performed. For example, if the background noise is traffic noise that has highest levels at low frequencies, the volume control system may determine stronger dynamic range compression for audio signals from music applications than for audio signals from voice calling applications because low frequency noise disturbs music listening more than listening to speech.

The volume level for each downlink audio signal at different sub-sections may be preconfigured for a volume control system, for example, so that the main downlink audio signal of an active application will be played at higher level than other simultaneous downlink audio signal(s) at each sub-section or in at least one or some of the sub-sections. The audio signal processing algorithm(s), for example, DSP methods, for example equalization type or strength for downlink audio signal(s) at different sub-sections may be preconfigured so that the audio signal(s) are processed for improving user hearing experience. The type and strength of audio signal processing algorithm(s), for example, strength of equalization, may depend on which application's audio signal is in question. In addition, type and strength of audio signal processing algorithm(s), for example, strength of equalization, may depend on whether the audio signal is audio signal of active application or not or determined volume level of selected sub-section of the volume control range. Below is shown an example table of equalization intensities; mild, medium and strong as a function frequency of downlink audio signal.

| | Frequency (Hz) | | | | | | | | |
|---|---|---|---|---|---|---|---|---|---|
| | 63 | 125 | 250 | 500 | 1000 | 2000 | 4000 | 8000 | 1600 |
| Mild equalization | | | | | | | | | |
| Equalization (dB) | −4 | −1.5 | 0 | 1.5 | 2.5 | 2.5 | 2.5 | 1.5 | 0 |
| Medium equalization | | | | | | | | | |
| Equalization (dB) | −8 | −3 | 0 | 3 | 5 | 5 | 5 | 3 | 0 |
| Strong equalization | | | | | | | | | |
| Equalization (dB) | −16 | −6 | 0 | 6 | 10 | 10 | 10 | 6 | 0 |

FIG. 1 shows an apparatus according to an example embodiment. The apparatus 100 contains memory 101, at least one processor 102 and 103, and computer program code 104 residing in the memory 101. The apparatus 100 according to the example of FIG. 1, also has a volume control interface 105 i.e. volume control means 105, for example, a touch screen volume control interface or a volume control interface for controlling volume level of the apparatus by operating the volume control interface, for example, by pushing, pressing, touching, scrolling, turning, pulling or sliding by a user of the apparatus 100. The apparatus 100 may further comprise one, two or more audio signal capturing means, for example, microphones 106 and 107 for capturing or monitoring sound, for example, speech of a voice call or current noise conditions of surroundings, and one, two or more audio output means, for example, loudspeakers 108 and 109 for producing sound. Microphone 106 or 107 may also be used for generating data relating to the noise level of apparatus' 100 surroundings. The apparatus 100 may further comprise connecting means for audio signals 110, for example, an audio output, an audio socket i.e. an audio jack 110.

The apparatus may also comprise one or more displays 111. The apparatus 100 may also comprise an interface means (e.g. a user interface) which allows a user to interact with the apparatus 100. The user interface means may be implemented by using one or more of the following: the display 111, a keypad 112, or other structures. The apparatus 100 may be configured to connect to another device e.g. by means of a communication block (not shown in FIG. 1) able to receive and/or transmit information through a wireless or wired network and able to form a voice call connection over a mobile phone network or internet or any other type of connection.

Figure 2:
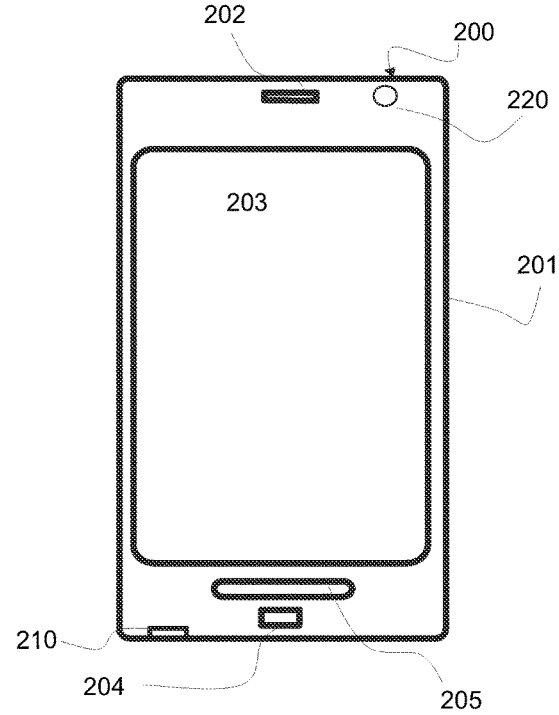
FIG. 2 shows a layout of an apparatus according to an example embodiment.

FIG. 2 shows a layout of an apparatus according to an example embodiment. The apparatus 200 is, for example, a mobile terminal, for example, a mobile phone, a smart phone, a tablet device or other type of a smart device. Embodiments of the invention may be implemented within any other electronic device or apparatus such a personal computer and a laptop computer.

The apparatus 200 shown in FIG. 2 comprises a housing 201 for incorporating and protecting the apparatus. The apparatus 200 may further comprise an audio output means, which in embodiments of the invention may be any one of: an earpiece 202, speaker of an analogue audio or analogue output connection or digital audio output connection suitable to produce audio signal. The apparatus may comprise a microphone 204 or any suitable audio input which may be a digital or analogue signal input. The apparatus 200 may further comprise a display 203 in the form of e.g. a liquid crystal display. In other embodiments of the invention, the display is any suitable display technology suitable to display an image or video. The apparatus 200 may further comprise a keypad 205 or other data input means. In other embodiments of the invention any suitable data or user interface mechanism may be employed. For example, the user interface may be implemented as a virtual keyboard or data entry system as part of a touch-sensitive display. The apparatus 200 of FIG. 2 also comprises a battery. The apparatus 200 according to an embodiment may also comprise an infrared port for short range line of sight communication to other devices. In other embodiments, the apparatus 200 may further comprise telecommunication means suitable for forming a phone connection to other device(s). In other embodiments, the apparatus 200 may further comprise any suitable short range communication solution such as, for example, a Bluetooth wireless connection, Near Field Communication (NFC) connection or a USB/firewire wired connection. The apparatus 200 may further comprise connecting means for down link audio signals 210. The apparatus 200 may further comprise a camera sensor 220.

Figure 3A:
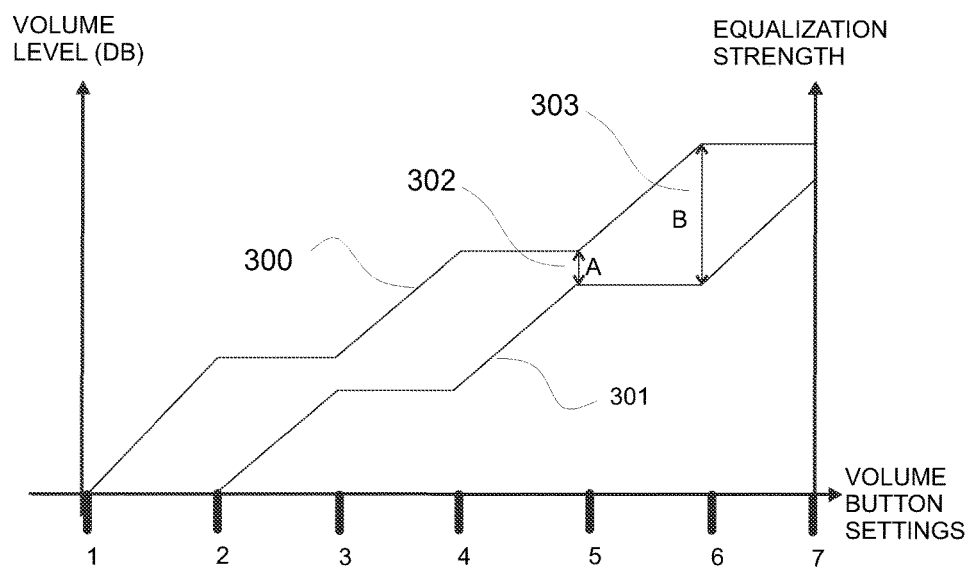
FIG. 3a shows a graph representing volume levels of two audio signals at different volume interface sub-sections according to an embodiment of the invention.

FIG. 3a shows a graph representing volume levels of two audio signals at different volume sub-sections according to an embodiment of the invention. First audio signal is a speech signal and its volume level 300 and the second audio signal is a music signal and its volume level 301. The speech signal volume level 300 is predetermined for a volume control system of a device to be the main signal and it is also the active application's signal. The music signal is the background signal. Volume levels of the speech signal 300 and the music signal 301 are shown at each sub-section 1-7 of a volume control range. In addition, by an arrow A 302 it is indicated a minimum relative difference of the speech signal volume level 300 and the music signal volume level 301 and by an arrow B 303 it is indicated a maximum relative difference of the speech signal volume level 300 and the music signal volume level 301. The minimum relative difference 302 may also be zero. The user of the device may change from one sub-section to another, for example, by operating the volume control interface or by any other way which changes the sub-section. Operating the volume control interface may first move the user inside a sub-section either in steps or steplessly, for example, for enabling determination of current volume level, and only after several pushes or a long push the sub-section may be changed.

Figure 3B:
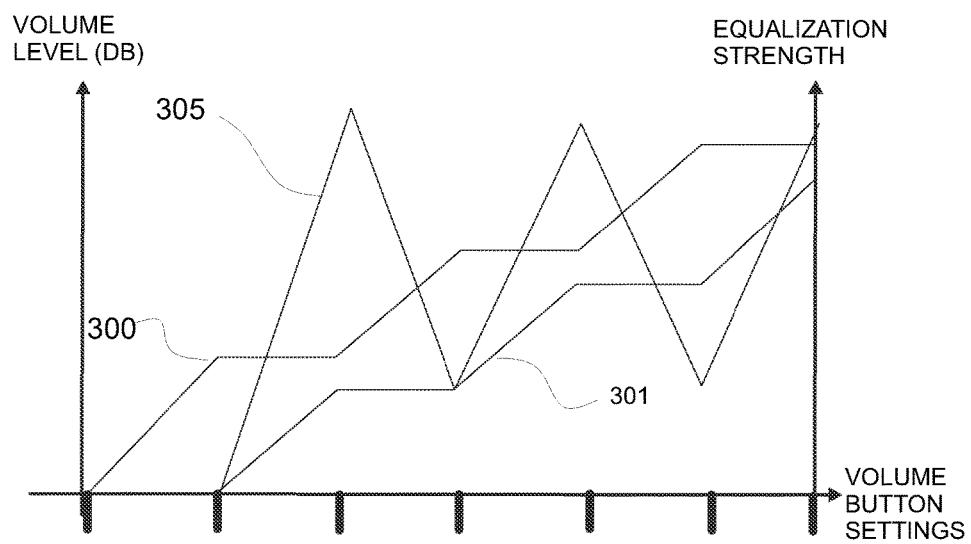
FIG. 3b shows a graph representing volume levels of two audio signals at different volume interface sub-sections and equalization strength at interface sub-sections according to an embodiment of the invention.

FIG. 3b shows a graph representing volume levels of two audio signals at different volume sub-sections according to an embodiment of the invention. First audio signal is a speech signal and its volume level 300 and the second audio signal is a music signal and its volume level 301. The speech signal is again predetermined to be the main signal and it is also the active application's signal. The music signal is the background signal. Volume levels of the speech signal 300 and the music signal 301 are shown at each sub-section 1-7 of a volume control range. In addition, an equalization strength curve 305 of the speech signal is shown. The equalization strength curve 305 shows strength of equalization method for the speech signal at each sub-section 1-7 of the volume control range.

Figure 4:
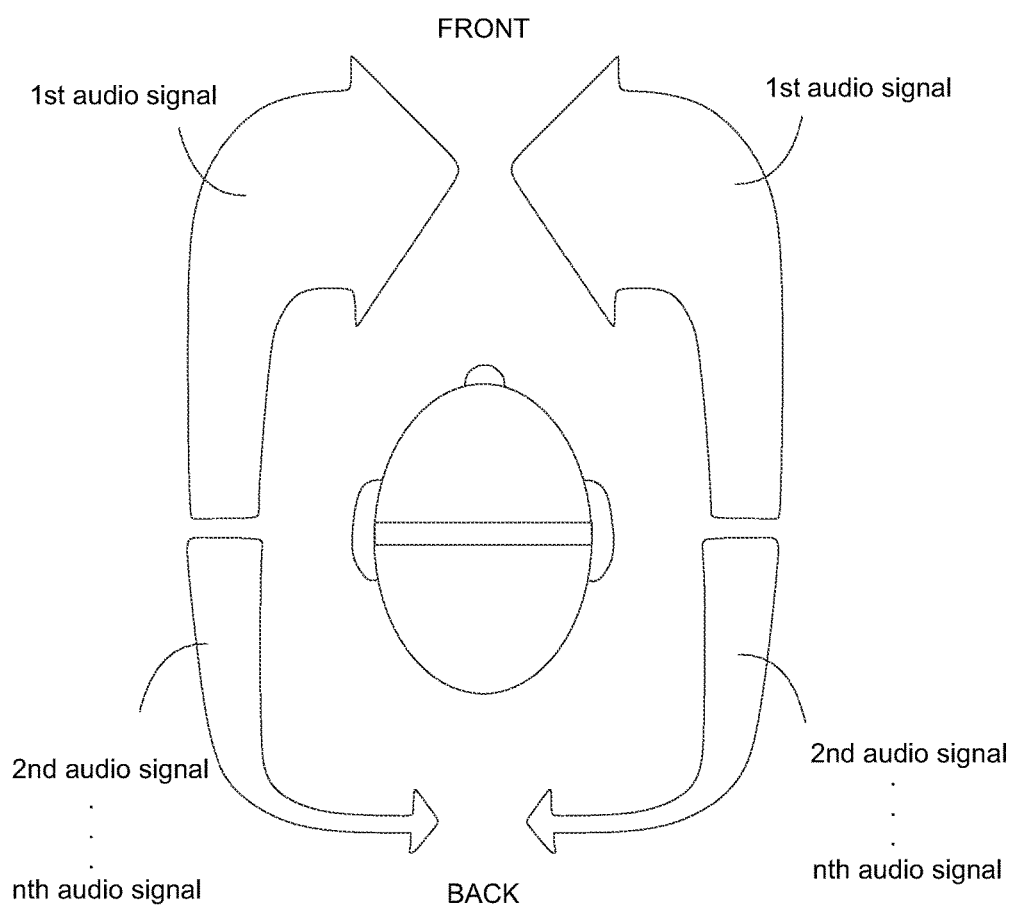
FIG. 4 shows a spatial location transfer of downlink audio signals of at least two applications according to an embodiment of the invention.

A volume control interface according to an embodiment of the invention may further be used for controlling spatial location of downlink audio signals, sounds, of at least two applications in addition to controlling voice levels and/or signal processing algorithms i.e. optimization. Increasing the spatial separation of audio signals increases the user's ability to focus on the main i.e. active application's audio signal and to ignore the other audio signal(s) or not to be disturbed by the other audio signal(s). The active application's audio signal may be located on the front side of the user, because people usually can focus on frontal sounds easier. The spatial separation may be controlled with the volume control interface. For example, lower sub-sections of a volume control range, for example, 1-5 of a total of 10 sub-sections, separates audio signals less and volume levels remain low. Volume level of the active application may be quite low and volume level of a non-active application or applications may be even lower. Upper sub-sections of the volume control range, for example, 6-9 of a total of 10 sub-sections separates sounds more. Volume level of the active application is increased and volume level(s) of a non-active application or applications may still be lower. The last sub-section (highest volume level state i.e. sub-section 10 of a total of 10 sub-sections) may then separate sounds totally, so that spatial image of audio signal of the active application is moved to the foreground and the spatial image of non-active application or applications is/are moved to the background. Volume level of the active application may be increased, for example, to maximum, and simultaneously the volume level or levels of a non-active application or applications are decreased or at least they are at the lower level. Example of this embodiment of the invention showing spatial location transfer of downlink audio signals of at least two applications performed with operation of a volume control interface is shown in FIG. 4.

Active application volume level may also be controlled automatically so that an active application volume level is comfortably above the sum of the background noise level and other applications' volume levels. A microphone may be used to detect the background noise level and the sum of the background noise level and the other applications' sounds may be used to automatically control the volume level of the active application. In this way the active application volume level is always clearly audible in the presence of other application audio signal(s) and/or background noise. This automatic controlling state may be set/selected by using access menus of settings or the device may be configured so that one sub-section of the volume control range is this so called automatic controlling state, and the user can select this state by the user control interface.

Figure 5:
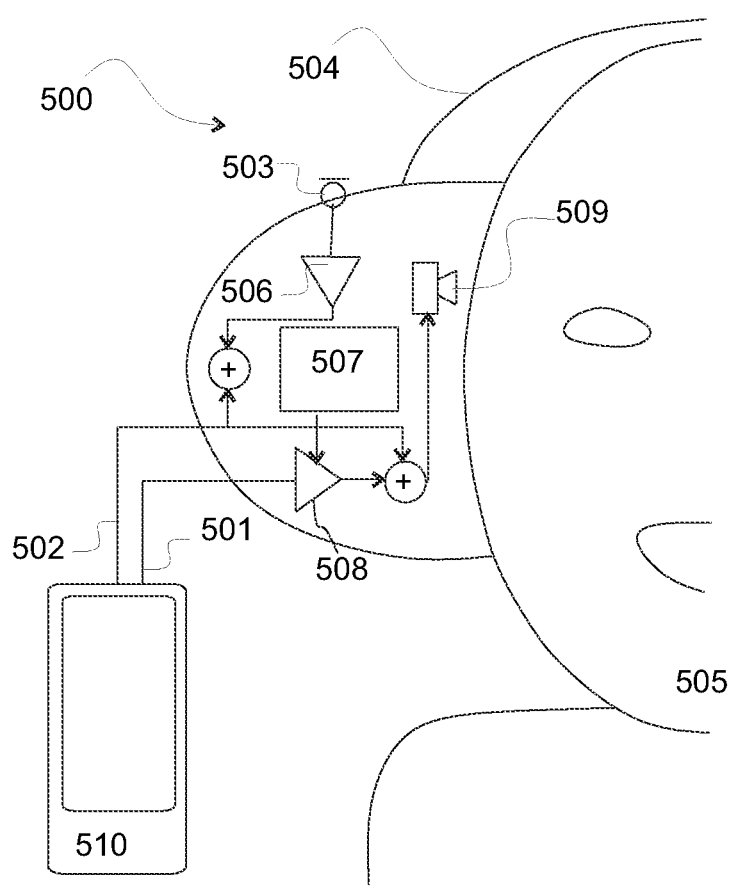
FIG. 5 shows an automatic audio signal processing system according to an embodiment of the invention.

The automatic controlling state may be selected if user wants to hear the audio signal from the active application loud and audio signals from all other applications more quiet, without further controlling. In other words, in automatic controlling state, the device selects configurations for audio signals, which it determines to be the best in that situation. FIG. 5 shows an example of an automatic audio signal controlling system 500 according to an embodiment of the invention. By an automatic controlling method of the automatic audio signal controlling system 500, it is possible to automatically control volume level of audio signal of an active application, e.g. speech in a call 501 of a device 510 on the basis surrounding noise level and/or volume level of other non-active application audio signal(s) 502 of the device 510. The noise signal may be measured using a microphone 503. An estimate of the effect of the headphones 504 on the noise (noise travels through the headphones 504 to the user's 505 ear) may be done, for example, with an attenuator (e.g. 6 dB) 506. A more complex estimate may be done by filters that model the transfer function of audio signal going through the headphones 504. The attenuated noise and audio signal of non-active application(s) 502 may be added together to form an input of the noise estimator 507. The noise estimator 507 may determine a long-term, for example, 5-20 s, average of an estimated noise level. Also, frequency dependent noise estimates may be used. A gain block 508 increases the volume level of the active application 501 above the estimated noise level e.g. by 3 dB. In this way a speaker 509 may output the audio signal of the active application 501 above the estimated noise level from the headphones 504 to the user 505. The system 500 may also check that volume level of the active application audio signal 501 is not raised too high to avoid hearing damage. It is also possible to combine digital signal processing algorithms in automatic controlling method in addition to volume level control for audio adjusting one or more audio signals of active or non-active applications 501 or 502.

Figure 6:
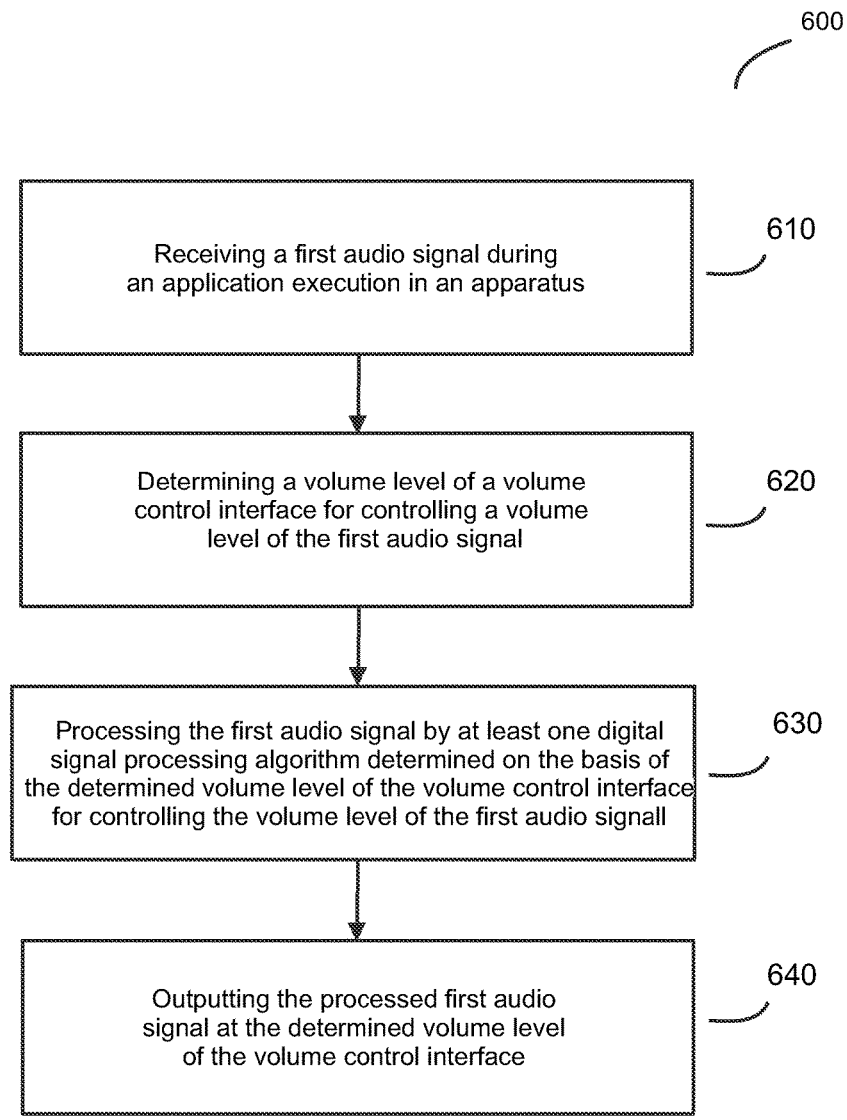
FIG. 6 shows an audio signal processing method according to an embodiment of the invention.

FIG. 6 shows an audio signal processing method according to an embodiment of the invention. In the method 600, in step 610 a first audio signal is received during an application execution in an apparatus. In step 620, a volume level of a volume control interface is determined for controlling a volume level of the first audio signal. In step 630, the first audio signal is processed by at least one digital signal processing algorithm determined on the basis of the determined volume level of the volume control interface for controlling the volume level of the first audio signal. In step 640, the processed first audio signal is outputted at the determined volume level of the volume control interface.

The various embodiments may provide several advantages, for example, a user controllable interface, for example, a single volume control interface, can be used to control both volume level of at least one audio signal and to process at least one DSP algorithm such as equalization, DRC etc. Also, with the single volume control interface the user can receive an improved output audio signal of active application, which can be very important in situations when background noise and/or audio signal of non-active application(s) influence the perception. Further, the single user control interface is a simple and transparent way to control and process audio signal(s) to be outputted. Therefore, a volume control interface may be considered as a new user interface in smart devices.

As explained above, it is possible to determine many functionalities for one single volume control interface. With the control interface, the user can control and process downlink audio signals, sounds, of two or more applications. Further user can control volume and spatial location with the same volume control interface. Also active application volume level may be selected to be controlled automatically in presence of background noise and/or other application audio signals, by selecting automatic controlling state by the volume control interface.

A volume control system receives an audio signal from an application, wherein the term "application" may in this context be any mean of a device producing audio signal(s) or receiving audio signal(s) for re-producing (playing i.e. outputting). Application may therefore be, for example, an actual application such a music player or a telecommunication application arranged to transmit recipient's voice for the user of the device.

The various embodiments of the invention can be implemented with the help of computer program code that resides in a memory and causes the relevant apparatuses to carry out the invention. For example, a device may comprise circuitry and electronics for handling, receiving and transmitting data, computer program code in a memory, and a processor that, when running the computer program code, causes the device to carry out the features of an embodiment.

It is obvious that the present invention is not limited solely to the above-presented embodiments, but it can be modified within the scope of the appended claims.

The invention claimed is:

1. A method, comprising:
receiving a first audio signal during an application execution in an apparatus;
determining a volume level based on a volume control interface for controlling a volume level of the first audio signal, wherein the volume control interface is configured to operate in at least two different sub-sections forming a volume control range for the executed application;
selecting one of the at least two different sub-sections based on the determined volume level;
determining a first digital signal processing algorithm associated with an equalization and a second digital signal processing algorithm which is different from the equalization configured to operate in the selected sub-section, wherein the first and the second digital signal processing algorithms are to be performed in accordance with the selected sub-section and the executed application providing the first audio signal;
processing the received first audio signal by the determined first and second digital signal processing algorithms; and
outputting the processed first audio signal at the determined volume level based on the volume control interface.

2. The method according to claim 1, wherein determining the volume level based on the volume control interface is performed as a response to operation of the volume control interface.

3. The method according to claim 1, wherein the first and the second digital signal processing algorithms change as a function of the volume level.

4. The method according to claim 1, wherein the method further comprises adjusting the volume level of the received first audio signal as a response to the volume level based on the volume control interface.

5. The method according to claim 4, wherein the method further comprises:
determining the volume level of the first audio signal after adjustment;
selecting one of the at least two different sub-sections based on the determined volume level of the adjusted first audio signal;
performing determining of the first and the second digital signal processing algorithms configured to operate in the selected sub-section, wherein first and the second digital signal processing algorithms are optimized in accordance with the selected sub-section and the executed application providing the adjusted first audio signal; and
performing processing and outputting steps on the basis of determined volume level of the first audio signal after adjustment and on the basis of the executed application providing the adjusted first audio signal.

6. The method according to claim 1, wherein the method further comprises:
receiving a second audio signal during a second application execution in the apparatus simultaneously with the first audio signal;
determining a volume level of the second audio signal;
selecting one of the at least two different sub-sections based on the determined volume level of the second audio signal,
determining respective first and the second digital signal processing algorithms configured to operate in the selected sub-section for the second audio signals during the second application execution and the respective first and the second digital signal processing algorithms are to be performed in in accordance with the selected sub-section and the second executed application transmitting the second audio signal;
processing the received second audio signal by the determined respective first and second digital signal processing algorithms; and
outputting the processed second audio signal at the determined volume level of the second audio signal during the second application execution and during outputting of the processed first audio signal.

7. The method according to claim 6, wherein the method further comprises adjusting volume levels of the processed first audio signal and the processed second audio signal so that the first audio signal is outputted at a first volume level and the second audio signal is outputted at a second volume level.

8. The method according to claim 6, wherein the method further comprises controlling spatial location of the first and the second audio signals before outputting the processed first and the second audio signals so that the first audio signal is arranged to be located on the front side of a user and the second audio signal is arranged to be located on the back side of the user.

9. The method according to claim 1, wherein the first digital signal processing algorithm is an equalization method.

10. The method according to claim 1, further comprising determining another digital signal processing algorithm to implement a dynamic range compression (DRC) method.

11. The method according to claim 1, wherein the method further comprises:
  determining an environment noise level, and
  adjusting at least in part the volume level of the first audio signal on the basis of the determined environment noise level.

12. The method according to claim 1, wherein the first and the second digital signal processing algorithms are preconfigured for at least one volume level.

13. An apparatus comprising at least one processor, and memory including computer program code, the memory and the computer program code configured to, with the at least one processor, cause the apparatus to perform at least the following:
  receive a first audio signal during an application execution in an apparatus;
  determine a volume level based on a volume control interface for controlling a volume level of the first audio signal, wherein the volume control interface is configured to operate in at least two different sub-sections forming a volume control range for the executed application;
  select one of the at least two different sub-sections based on the determined volume level;
  determine a first digital signal processing algorithm associated with equalization and a second digital signal processing algorithm which is different from the equalization configured to operate in the selected sub-section, wherein the first and the second digital signal processing algorithms are to be performed in accordance with the selected sub-section and the executed application providing the first audio signal;
  process the received first audio signal by the determined first and second digital signal processing algorithms; and
  output the processed first audio signal at the determined volume level based on the volume control interface.

14. The apparatus according to claim 13, wherein the volume based on of the volume control interface is determined as a response to operation of the volume control interface.

15. The apparatus according to claim 13, wherein the first and the second digital signal processing algorithms change as a function of the volume level.

16. The apparatus according to claim 13, wherein the apparatus is further caused to adjust the volume level of the received first audio signal as a response to the volume level based on the volume control interface.

17. The apparatus according to claim 16, wherein the apparatus is further caused to:
  determine the volume level of the first audio signal after adjustment;
  select one of the at least two different sub-sections based on the determined volume level of the adjusted first audio signal;
  perform determining of the first and the second digital signal processing algorithms configured to operate in the selected sub-section and the first and the second digital signal processing algorithms are tailored in accordance with the selected sub-section and the executed application providing the adjusted first audio signal; and
  perform processing and outputting on the basis of determined volume level of the first audio signal after adjustment and on the basis of the executed application providing the adjusted first audio signal.

18. The apparatus according to claim 13, wherein the apparatus is further caused to:
  receive a second audio signal during a second application execution in the apparatus simultaneously with the first audio signal;
  determine a volume level of the second audio signal;
  select one of the at least two different sub-sections based on the determined volume level of the second audio signal,
  determine respective first and the second digital signal processing algorithms configured to operate in the selected sub-section for the second audio signals during the second application execution and the respective first and the second digital signal processing algorithms are to be performed in accordance with the selected sub-section and the second executed application transmitting the second audio signal;
  process the received second audio signal by the determined respective first and second digital signal processing algorithms; and
  output the processed second audio signal at the determined volume level of the second audio signal during the second application execution and during outputting of the processed first audio signal.

19. The apparatus according to claim 18, wherein the apparatus is further caused to adjust volume levels of the processed first audio signal and the processed second audio signal so that the first audio signal is outputted at a first volume level and the second audio signal is outputted at a second volume level.

20. A computer program product comprising at least one non-transitory computer readable medium storing a computer program, the computer program comprising instructions causing, when executed on at least one processor, at least one apparatus to:
  receive a first audio signal during an application execution in an apparatus;
  determine a volume level based on the volume control interface for controlling a volume level of the first audio signal, wherein the volume control interface is configured to operate in at least two different sub-sections forming a volume control range for the executed application;
  select one of the at least two different sub-sections based on the determined volume level;
  determine a first digital signal processing algorithm associated with equalization and a second digital signal processing algorithm which is different from the equalization configured to operate in the selected sub-section, wherein the first and the second digital signal processing algorithms are to be performed in accordance with the selected sub-section and the executed application providing the first audio signal;
  process the received first audio signal by the determined first and second digital signal processing algorithms; and
  output the processed first audio signal at the determined volume level based on the volume control interface.

* * * * *